United States Patent

Nassimi

[11] Patent Number: 5,564,182
[45] Date of Patent: Oct. 15, 1996

[54] METHOD FOR INSTALLING AXIAL MULTIPLE

[76] Inventor: Shary Nassimi, 2002 NW. 215 Cir., Ridgefield, Wash. 98642

[21] Appl. No.: 438,026

[22] Filed: May 8, 1995

Related U.S. Application Data

[63] Continuation-in-part of Ser. No. 230,693, Apr. 21, 1994.
[51] Int. Cl.$^6$ ............................................. H05K 3/34
[52] U.S. Cl. ........................... 29/839; 29/840; 228/180.21
[58] Field of Search ............................ 29/837, 839, 840; 361/760, 773; 228/35, 37, 180.1, 180.21

[56] References Cited

U.S. PATENT DOCUMENTS

| | | | |
|---|---|---|---|
| 4,187,339 | 2/1980 | Cayrol | 29/839 X |
| 4,287,667 | 9/1981 | Urishiyama | 29/837 |
| 4,545,520 | 10/1985 | Kent | 228/180.1 |
| 4,641,222 | 2/1987 | Derfiny et al. | 361/403 |
| 4,759,120 | 7/1988 | Bernstein | 29/840 X |
| 4,868,637 | 9/1989 | Clements et al. | 357/72 |
| 4,999,136 | 3/1991 | Su et al. | 252/512 |
| 5,241,134 | 8/1993 | Yoo | 228/180.21 X |
| 5,319,525 | 6/1994 | Lightfoot | 361/760 |

FOREIGN PATENT DOCUMENTS

| | | | |
|---|---|---|---|
| 0069091 | 3/1989 | Japan | 439/83 |
| 2202091 | 8/1990 | Japan | 439/83 |
| 3263841 | 11/1991 | Japan | 361/760 |
| 4132183 | 5/1992 | Japan | 228/180.1 |
| 872748 | 1/1960 | United Kingdom | 29/837 |

*Primary Examiner*—Peter Vo
*Attorney, Agent, or Firm*—Richard L. Miller, P.E.

[57] ABSTRACT

A method for installing an axial multiple connection component, for connecting to a circuit board, comprising a shell, the shell substantially cylindrical, having two opposite ends. Conducting leads extend from the opposite ends along the axis, for providing two isolated connections to other components on the circuit board. At least one contact ring encircles the shell with the axis at the center of the contact ring, and provides another connection to the other components on the circuit board. The conducting leads are inserted into lead holes on the circuit board, and the contact ring rests against a metallically plated through ring hole. The component is either manually solder utilizing a solder melting tool or alternatively wave soldered onto the circuit board, with the solder wicking up the plated through ring hole to the contact ring to make a good electrical contact therebetween.

3 Claims, 1 Drawing Sheet

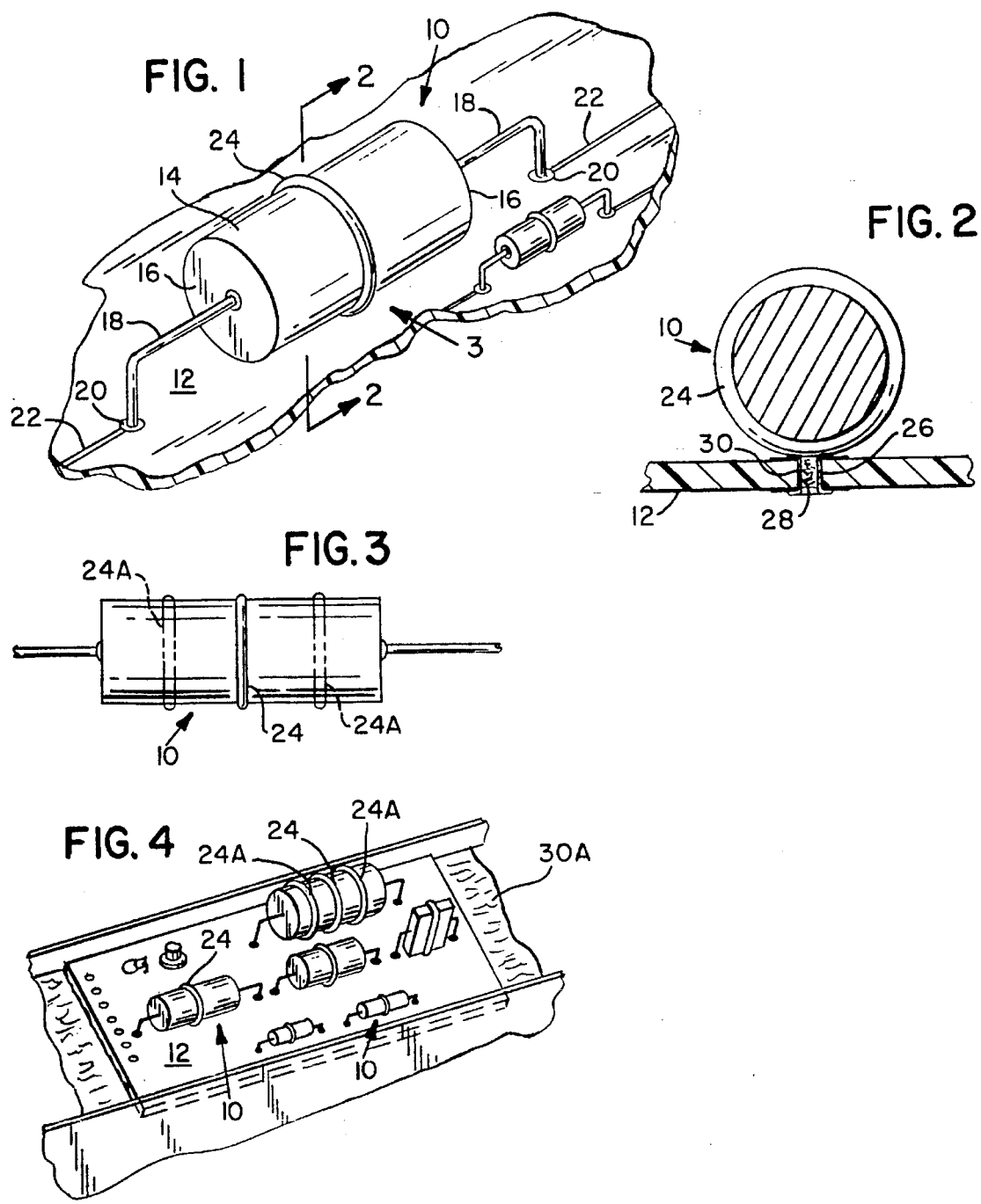

METHOD FOR INSTALLING AXIAL MULTIPLE

CROSS REFERENCES

This application is a continuation in part of copending application titled: AXIAL MULTIPLE CONNECTION COMPONENT, filed on Apr. 21, 1994 with Ser. No. 08/230693.

BACKGROUND OF THE INVENTION

The instant invention relates to an axial multiple connection component. More particularly, the invention relates to an axial electronic component and method, in which provisions are made for making more than two isolated electrical connections to the component.

Conventional axial components allow two connections. The conventional axial package is substantially cylindrical. Two conducting elements extending from each of the two ends of the cylinder along its axis.

Due to the symmetrical nature of the axial component, they are quite amenable to automatic insertion into circuit boards. Machines are readily available to insert these components on a large scale. The components are arranged in continuous belts of components. These belts are fed into the insertion equipment, which removes each component from the belt, bends both leads at right angles, and inserts it into a circuit board at the desired location.

Manufacturers have enjoyed the convenience of the axial package and use them whenever possible. Resistors, capacitors, inductors, diodes, indicator lights, and two-leaded noise suppression devices are among the many components packaged axially to take advantage of its inherent advantages.

To date, the components exploiting the axial packaging advantage could have no more than two connections, one at each opposite end of the package. This left out one of the most important electronic component of the this century: the transistor.

Many components, such as the common transistor, FETs, and integrated circuits require three or more isolated electrical connections to other components in the circuit in which they are used.

The industry's attempts at solutions have varied, but include hand insertion of the multiple connection components, and insertion of these components with specialized equipment.

While these units may be suitable for the particular purpose employed, or for general use, they would not be as suitable for the purposes of the present invention as disclosed hereafter.

SUMMARY OF THE INVENTION

It is an object of the invention to produce an axial electronic component that allows more than two isolated electrical connections.

It is another object to produce an axial electronic component that can be inserted into a circuit board automatically, and are compatible with axial automatic, semi-automatic or axial prep machinery.

It is a further object of the invention to produce a transistor in an axial package.

The invention is an axial multiple connection component, for connecting to a circuit board, comprising a shell, the shell substantially cylindrical, having two opposite ends, and axial leads exiting the two opposite ends. Conducting leads extend from the opposite ends along the axis, for providing two isolated connections to other components on the circuit board. A contact ring encircles the shell with the axis at the center of the contact ring, and provides another connection to the other components on the circuit board. The conducting leads are inserted into lead holes on the circuit board, and the contact ring rests against a metallically plated through ring hole. The component is wave soldered onto the circuit board, with the solder wicking up the plated through ring hole to the contact ring to make a good electrical contact therebetween.

Alternatively the component may be manually soldered onto the circuit board utilizing a solder melting tool, with the solder being caused to flow and wick up the plated through ring hole to the contact ring to make a good electrical contact therebetween.

To the accomplishment of the above and related objects, the invention may be embodied in the form illustrated in the accompanying drawings. Attention is called to the fact, however, that the drawings are illustrative only. Variations are contemplated as being part of the invention, limited only by the scope of the claims.

BRIEF DESCRIPTION OF THE DRAWINGS

In the drawings, like reference numerals depict like elements throughout the several views. The drawings are briefly described below.

FIG. 1 is a diagrammatic perspective view illustrating a typical embodiment of the instant invention installed on a printed circuit board.

FIG. 2 is a cross sectional view taken on line 2—2 of FIG. 1.

FIG. 3 is a side elevational view taken in the direction of arrow 3 in FIG 1, also showing in phantom the placement of other typical radial connecting elements.

FIG. 4 is a diagrammatic perspective view, illustrating a printed circuit board with several embodiments of the instant invention being wave soldered.

DETAILED DESCRIPTION OF THE PREFERRED EMBODIMENTS

FIG. 1 illustrates a typical embodiment of the axial component 10 installed on a printed circuit board 12. The axial component 10 has a shell 14. The shell 14 is substantially cylindrical in shade and typically a circular cylinder, having two parallel opposite ends 16 and an imaginary axis that passes through a center of the two opposite ends 16. Conducting leads 18 extend from the shell 14 from each of the two opposite ends 16 along the axis. Although the shell 14 is substantially cylindrical, the shell 14 is often rounded or tapered to the conducting leads 18 at the opposite ends 16. The shell 14 is made of an electrically insulating material.

The conducting leads 18 extend axially from the shell 14 and are bent at right angles toward the circuit board 12. The conducting leads 15 extend into lead holes 20 in the circuit board 12. Interconnect lands 22 electrically connect the lead holes 20 to other components on the circuit board 12. The conducting leads are electrically isolated from each other. By the definition of electrically isolated referred to herein, the relation of the conducting leads to one another is something other than a low impedance connection between the two which would make them akin to being a single electrical node, and is obviously determined by the nature and characteristic of the component.

The axial component 10 also has a contact ring 24 for providing an additional isolated electrical connection with the circuit board 12. For example, a typical bipolar transistor having a base, emitter and collector could be implemented. The two conducting leads 18 could represent connections to the emitter and collector of the transistor. The contact ring 24 would then represent a connection to base of the transistor.

The contact ring 24 encircles the shell 14, with the axis of the shell 14 at the center of the contact ring 24. The contact ring 24 is located on the shell 14 equidistant from the opposite ends 16.

FIG. 2 is a cross section view of the circuit board 12 and axial component 10. The circuit board 12 has a plated through ring hole 26, having metallically plated inner surfaces 28. The plated through ring hole 26 and metallically plated inner surfaces 28 are attached to interconnect lands, to electrically connect the plated through ring hole with other components in the circuit.

The contact ring 24 rests against the plated through ring hole 26. The plated through ring hole 26 is filled with solder 30, to electrically connect the contact ring 24 with the plated inner surfaces 28 and interconnect lands. The plated through ring hole may be larger than the lead holes, to increase the area of contact between the plated through ring hole 26 and contact ring 24. In addition, the plated through ring hole 26 may be elongated, to accommodate a larger portion of the contact ring 24, providing greater mechanical support, and a larger surface area for electrical contact therebetween.

FIG. 3 illustrates the axial component 10, having the contact ring 24. As shown in phantom in FIG. 3, the axial component can have a pair of additional contact rings 24A. The contact ring 24, the additional contact rings 24A and the conducting leads 18 are all isolated from one another. The contact ring 24 and the additional contact rings 24A are substantially parallel to one another, and divide the shell 14 into equal portions.

The axial component 10 may have further additional contact rings 24A to an extent necessary to meet the requirements of the its functionality. The number of contact rings that could be embodied in one of the axial components 10 is limited by the size of the component, and the precision and tolerances of the component and circuit board manufacturing and insertion equipment.

FIG. 4 illustrates the axial components 10 being wave soldered onto the printed circuit board 12. The wave soldering operation can include dipping the printed circuit board 12 in an anti-oxidizing or "flux" bath. After thoroughly coating the metallic surfaces with the anti-oxidant, the printed circuit board 12 is then dipped into a bath of molten solder 30A, to a depth necessary to allow solder to adhere to all desired metallic surfaces.

To successfully solder the axial components 10, the solder must be allowed to wick up through the plated through ring holes 26 to provide a good electrical connection between each contact ring 24 and the metallic surfaces of its associated plated through ring hole 26.

It is to be noted that this method of installing the component on the circuit board requires that only two leads be inserted through the circuit board and that there is no complicated requirement for orienting a component with many leads into specific holes or are as is the case with many other multiple ported components which have a multitude of leads which must be electrically connected.

A natural result occurring utilizing this method is that simple machinery which can insert just two leaded components on a circuit board can now be utilized to install components which have many more then just two input/output terminals on a circuit.

The invention claimed is:

1. A method of installing an axial component having a shell having two opposite ends, conducting leads extending from the opposite ends along an axis, and a contact ring that encircles the shell with the axis at the center of the contact ring, to a printed circuit board, comprising the steps of:

a) inserting the component on a printed circuit board with the conducting leads extending into lead holes and the contact ring resting on a plated through ring hole; and b) wave soldering the component in place by dipping the board in a bath of molten solder and wicking solder up through the plated through ring hole to provide a good electrical connection between the contact ring and the metallic surfaces of the associated plated through ring hole.

2. A method of installing an axial component having a shell having two opposite ends, conducting leads extending from the opposite ends along an axis, and a contact ring that encircles the shell with the axis at the center of the contact ring, to a printed circuit board, comprising the steps of:

a) inserting the component on a printed circuit board with the conducting leads extending into lead holes and the contact ring resting on a plated through ring hole; and b) manually soldering the component in place by utilizing a solder melting tool and causing molten solder to flow and wick up through the plated through ring hole to provide a good electrical connection between the contact ring and the metallic surfaces of the associated plated through ring hole.

3. A method of installing an axial component having a shell having two opposite ends, conducting leads extending from the opposite ends along an axis, and a contact ring that encircles the shell with the axis at the center of the contact ring, to a printed circuit board, comprising the steps of:

a) utilizing machinery capable of inserting component having just two leads on a printed circuit board with the conducting leads extending into lead holes and the contact ring resting on a plated through ring hole; and b) soldering the component in place by causing molten solder to flow and wick up through the plated through ring hole to provide a good electrical connection between the contact ring and the metallic surfaces of the associated plated through ring hole.

* * * * *